United States Patent
Huang et al.

(10) Patent No.: US 9,013,907 B2
(45) Date of Patent: Apr. 21, 2015

(54) CONTENT ADDRESSABLE MEMORY AND RELATED COLUMN REPAIR METHOD

(71) Applicant: Mediatek Inc., Hsin-Chu (TW)

(72) Inventors: Rei-Fu Huang, Hsinchu (TW); Hang-Kaung Shu, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/043,852

(22) Filed: Oct. 2, 2013

(65) Prior Publication Data

US 2014/0104914 A1 Apr. 17, 2014

Related U.S. Application Data

(60) Provisional application No. 61/712,945, filed on Oct. 12, 2012.

(51) Int. Cl.
*G11C 15/00* (2006.01)

(52) U.S. Cl.
CPC ........................................ *G11C 15/00* (2013.01)

(58) Field of Classification Search
CPC .......................................................... G11C 15/00
USPC ........................................................ 365/49.17
See application file for complete search history.

(56) References Cited

U.S. PATENT DOCUMENTS

| 6,657,878 | B2 | 12/2003 | Lien | |
|---|---|---|---|---|
| 6,665,220 | B2 * | 12/2003 | Vlasenko | ...................... 365/200 |
| 6,714,430 | B1 | 3/2004 | Srinivasan | |
| 7,117,400 | B2 * | 10/2006 | Batson et al. | .................. 714/711 |

* cited by examiner

*Primary Examiner* — Hoai V Ho
*Assistant Examiner* — Tri Hoang
(74) *Attorney, Agent, or Firm* — Winston Hsu; Scott Margo

(57) ABSTRACT

A content addressable memory (CAM) has a CAM array, a path selection circuit and a control circuit. The CAM array has a plurality of main columns of CAM cells and at least one redundant column of CAM cells. The path selection circuit receives an input search data, and outputs a plurality of bits of the input search data to a plurality of selected columns in the CAM array, respectively. The control circuit controls the path selection circuit to couple to the selected columns, and sets each CAM cell of at least one faulty column found in the main columns at a match state. The at least one faulty column is not included in the selected columns, and the at least one redundant column is included in the selected columns.

16 Claims, 4 Drawing Sheets

CONTENT ADDRESSABLE MEMORY AND RELATED COLUMN REPAIR METHOD

CROSS REFERENCE TO RELATED APPLICATIONS

This application claims the benefit of U.S. provisional application No. 61/712,945, filed on Oct. 12, 2012 and incorporated herein by reference.

BACKGROUND

The disclosed embodiments of the present invention relate to performing data comparison, and more particularly, to a content addressable memory and related column repair method.

An essential semiconductor device is a semiconductor memory, such as a random access memory (RAM). A RAM allows a memory circuit to execute both read and write operations on its memory cells. Typical examples of RAM devices include the dynamic random access memory (DRAM) and the static random access memory (SRAM). Another form of the memory is a content addressable memory (CAM). A CAM is a memory device that accelerates any application requiring a fast search of a database. The CAM compares an input search data against a table of stored data, and returns the address of the matched data. In other words, in the CAM, stored data within a CAM array is not accessed by initially supplying an address, but rather by initially applying the input search data (e.g., a search word) to the CAM array and then performing a compare operation to identify one or more row locations within the CAM array that contain data equivalent to the applied input search data and thereby represent a "match" condition. In this manner, stored data is accessed according to its content rather than its address. Hence, the CAM device is a good choice for implementing a lookup operation due to its fast search capability. For example, due to their unique searching algorithms, the CAM devices are frequently employed in network equipment (particularly, routers and switches), computer systems and other devices that require rapid content searching.

As mentioned above, the main function of the CAM is data comparison based on data stored in the CAM array composed of a plurality of CAM cells, where each CAM cell may include an SRAM cell and a compare circuit. However, in the manufacture process, it is possible that the CAM array may have one or more faulty/defective CAM cells which fail to perform their intended functionality. Suppose that the CAM with faulty/defective CAM cells is used for store look-up table data and then perform data comparison. If the input search data is identical to data stored into a specific row with faulty/defective CAM cell(s), the CAM may fail to identify the specific row as having a match condition due to the faulty/defective CAM cell(s).

Thus, there is a need for a repair mechanism for allowing a CAM with faulty/defective CAM cell(s) to still produce a correct data comparison output.

SUMMARY

In accordance with exemplary embodiments of the present invention, a content addressable memory and related column repair method are proposed to solve the above-mentioned problem.

According to a first aspect of the present invention, an exemplary content addressable memory (CAM) is disclosed. The exemplary CAM includes a CAM array, a path selection circuit, and a control circuit. The CAM array has a plurality of main columns of CAM cells and at least one redundant column of CAM cells. The path selection circuit is arranged for receiving an input search data, and outputting a plurality of bits of the input search data to a plurality of selected columns in the CAM array, respectively. The control circuit is arranged for controlling the path selection circuit to couple to the selected columns, and setting each CAM cell of at least one faulty column found in the main columns at a match state, wherein the at least one faulty column is not included in the selected columns, and the at least one redundant column is included in the selected columns.

According to a second aspect of the present invention, an exemplary column repair method of a content addressable memory (CAM) is disclosed. The exemplary column repair method includes at least the following steps: setting each CAM cell of at least one faulty column found in a plurality of main columns of CAM cells at a match state, wherein the CAM has a CAM array comprising the main columns of CAM cells and at least one redundant column of CAM cells; receiving an input search data and outputting a plurality of bits of the input search data to a plurality of selected columns in the CAM array, respectively; wherein the at least one faulty column is not included in the selected columns, and the at least one redundant column is included in the selected columns.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

The present invention proposes a column repair mechanism for a content addressable memory (CAM). The CAM is manufactured to have a single redundant column or multiple redundant columns, depending upon actual application consideration/requirement. Hence, the redundant column(s) can serve as replacement of main columns in a CAM array.

Besides, each CAM cell of faulty/defective column(s) found in the main columns is set to have an always-match state, and this has no impact on the data comparison output. Further details are described as below.

Figure 1:
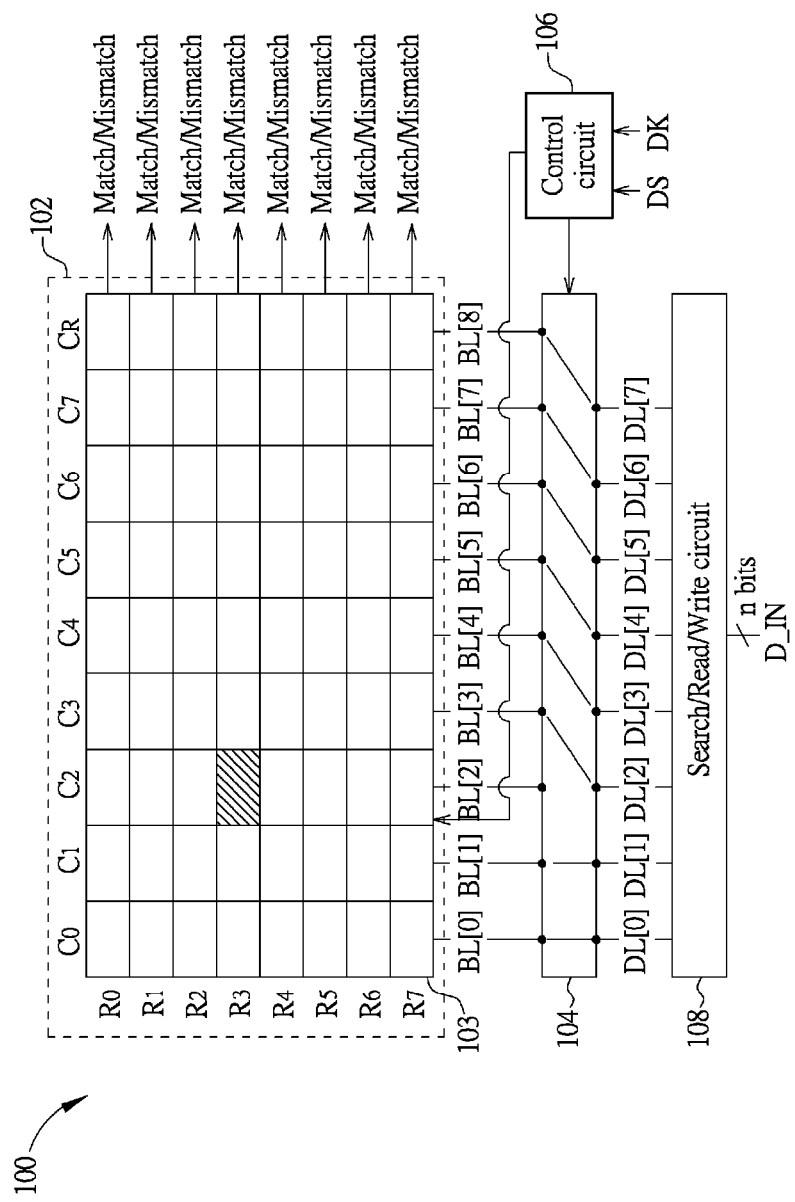
FIG. 1 is a diagram illustrating a CAM according to a first embodiment of the present invention.

Please refer to FIG. 1, which is a diagram illustrating a CAM according to a first embodiment of the present invention. In this embodiment, the CAM 100 includes a CAM array 102, a path selection circuit 104, a control circuit 106, and a search/read/write circuit 108. Please note that only the circuit components pertinent to the present invention are shown in FIG. 1. That is, the CAM 100 is allowed to have additional circuit components. The CAM array 102 includes a plurality of CAM cells 103 arranged in an array composed of a plurality of rows $R_0$-$R_7$ and a plurality of columns $C_0$-$C_7$, $C_R$, wherein each CAM cell 103 may include an SRAM cell and a compare circuit. In this embodiment, the CAM array 102 includes main columns $C_0$-$C_7$ of CAM cells 103 and a single redundant column $C_R$ of CAM cells 103. For example, during a search operation, the search/read/write circuit 108 is arranged to latch an N-bit input search data D_IN. The bit length of the input search data D_IN is equal to the number of main columns in the CAM array 102. In this example, N=8. The path selection circuit 104 is coupled between the CAM array 102 and the search/read/write circuit 108. The path selection circuit 104 is arranged for receiving bits of the input search data D_IN from the search/read/write circuit 108 via a plurality of data lines DL[0]-DL[7], respectively, and outputting bits of the input search data D_IN to a plurality of selected columns in the CAM array 102 via corresponding selected bit lines, respectively.

In this example, the CAM cell located at row $R_3$ and column $C_2$ is identified as a faulty CAM cell after the CAM array 102 is manufactured. Before the CAM array 102 is actually used for look-up table data storage and data comparison, the proposed column repair mechanism is activated to use the redundant column $C_R$ as replacement of one main column, thus preventing the faulty CAM cell $C_2$ from having impact on the comparison result of each row. In this embodiment, the control circuit 106 is coupled to the CAM array 102 and the path selection circuit 104. The control circuit 106 is responsible for controlling the path selection circuit 104 to couple to the selected columns, and setting each CAM cell 103 of the faulty column $C_2$ found in the main columns $C_0$-$C_7$ at a match state, wherein the faulty column $C_2$ is not included in the selected columns, and the redundant column $C_R$ is included in the selected columns.

As the match/mismatch condition of each row (i.e., the data compare output of each row) is determined by all CAM cells located at the same row, each CAM cell of the faulty column $C_2$ is set to the match state such that the CAM cells of the faulty column $C_2$ do not affect the data compare outputs of the rows. In this embodiment, the control circuit 106 may generate mask signals to each CAM cell of the faulty column $C_2$ to set the CAM cell at a "don't care" state. In this way, CAM cells of the faulty column $C_2$ may be regarded as bypassed since there is no mismatch path existing in each CAM cell of the faulty column $C_2$.

Figure 2:
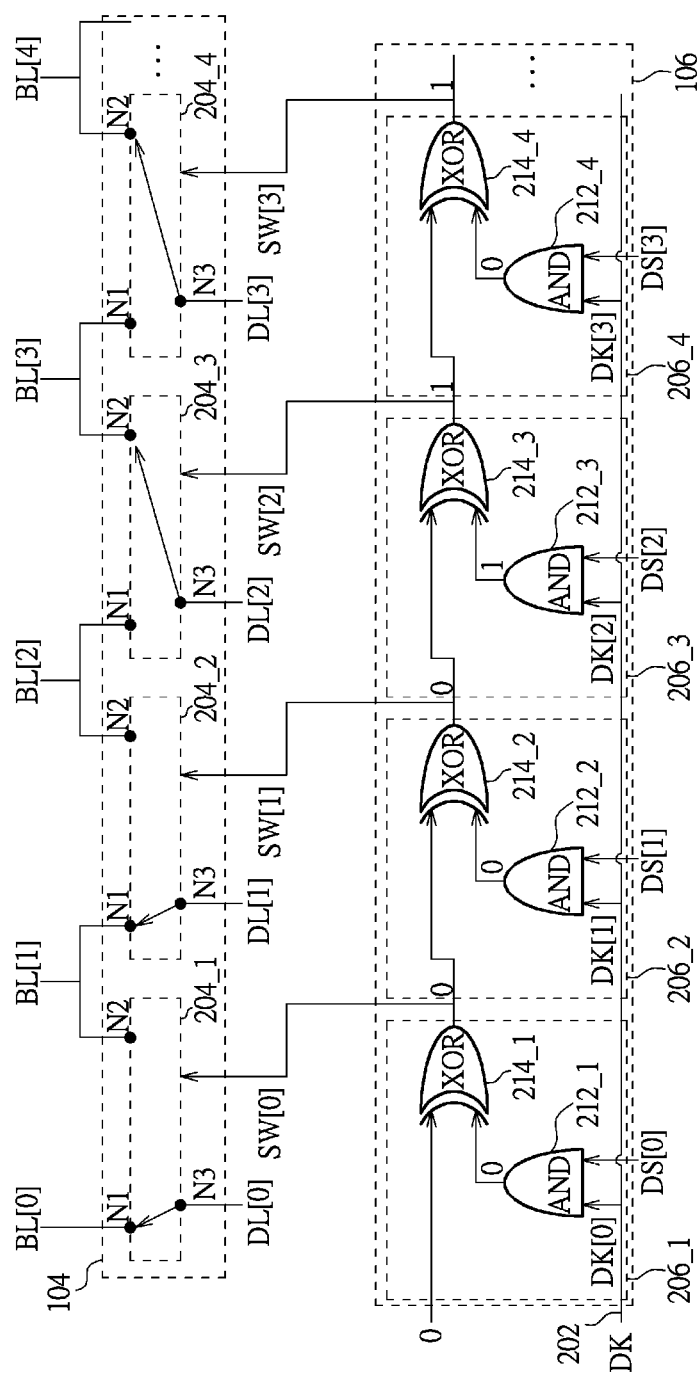
FIG. 2 is a circuit diagram of the control circuit and the path selection circuit shown in FIG. 1 according to an embodiment of the present invention.

With regard to the path selection circuit 104 which skips the faulty column $C_2$ and guides bits of the input search data (e.g., a search word) to the selected columns in the CAM array 102, please refer to FIG. 2. FIG. 2 is a circuit diagram of the control circuit 106 and the path selection circuit 104 shown in FIG. 1 according to an embodiment of the present invention. For simplicity and clarity, only part of the circuit architecture of the control circuit 106 and only part of the circuit architecture of the path selection circuit 104 are illustrated in FIG. 2. The path selection circuit 104 includes a plurality of switches (e.g., 204_1, 204_2, 204_3, and 204_4 shown in FIG. 2), and the control circuit 106 includes a plurality of control units (e.g., 206_1, 206_2, 206_3, and 206_4 shown in FIG. 2). Each of the switches 204_1-204_4 has an input port N3 and a plurality of output ports N1 and N2, and is controlled by the control circuit 106 to couple the input port N3 to one of the output ports N1 and N2. The input ports N3 of the switches 204_1-204_4 are arranged for receiving the bits of the input search data, respectively.

Besides, when the input port N3 of a current switch is coupled to the data line DL[n], the output port N1 of the current switch is coupled to the bit line BL[n], and the output port N2 of the current switch is coupled to the bit line BL[n+1]; and when the input port N3 of a next switch is coupled to the data line DL[n+1], the output port N1 of the next switch is coupled to the bit line BL[n+1], and the output port N2 of the next switch is coupled to the bit line BL[n+2]. The switch control signals SW[0], SW[1], SW[2], SW[3] are generated from the control circuit 106 to the switches 204_1-204_4, respectively. Each of the switches 204_1-204_4 is responsive to a single switch control signal. Hence, when a switch control signal is set by a first logic value (e.g., 0), a corresponding switch couples the input port N3 to the output port N1, and when the switch control signal is set by a second logic value (e.g., 1), the corresponding switch couples the input port N3 to the other output port N2.

In this embodiment, the control circuit 106 controls the path selection circuit 104 according to a predetermined syndrome pattern DS and a control key DK, where the bit length of the predetermined syndrome pattern DS is equal to the number of main columns of the CAM array 102, and the bit length of the control key DK is also equal to the number of main columns of the CAM array 102. The predetermined syndrome pattern DS is a fixed bit sequence which is set beforehand. When the faulty column $C_2$ is found by testing the CAM array 102, the control key DK may be programmed using an e-fuse device, where bits of the control key DK are set based on bits of the predetermined syndrome pattern DS and the identified faulty column $C_2$. Hence, by comparing bits of the control key DK and bits of the predetermined syndrome pattern DS, the control circuit 106 knows which one of the main columns in the CAM array 102 is a faulty column.

As shown in FIG. 2, the control key DK stored in the e-fuse device may be transmitted to the control units 206_1-206_4 via a bus 202. The control units 206_1-206_4 are arranged for controlling the switches 204_1-204_4 by generating the switch control signals SW[0]-SW[3] to the switches 204_1-204_4, respectively. Each of the control units 206_1-206_4 includes a compare unit 212_1/212_2/212_3/212_4 and a switch controller 214_1/214_2/214_3/214_4. By way of example, but not limitation, each of the compare unit 212_1-212_4 is implemented using an AND gate configured to perform an AND operation upon one bit DK[0]/DK[1]/DK[2]/DK[3] of the control key DK and one bit DS[0]/DS[1]/DS[2]/DS[3] of the predetermined syndrome pattern DS. As the main column $C_2$ is a faulty column, the control key DK is properly set such that compare results of compare units 212_1, 212_2 preceding the compare unit 212_3 and compare units (not shown) following the compare unit 212_3 all have a first logic value (e.g., 0), and only the compare result of the compare unit 212_3 has a second logic value (e.g., 1). In this way, the control circuit 106 knows that the main column $C_2$ is a faulty column and should be skipped.

By way of example, but not limitation, each of the switch controllers 214_1-214_4 is implemented using an XOR gate configured to perform an XOR operation upon the compare result (which is generated from a compare unit in the same control unit) and an input bit (which has a predetermined logic value (e.g., 0) or is a switch control signal generated from another control unit) to generate a switch control signal. As shown in FIG. 2, the control unit 206_1 is the first control unit. Hence, an input bit with the predetermined logic value (e.g., 0) is fed into the switch controller 214_1. As the compare result "0" of the compare unit 212_1 is identical to the input bit with the predetermined logic value "0", an output of the switch controller 214_1 is set by the first logic value "0" due to the XOR operation. Therefore, the switch control signal SW[0] is set by "0", and the main column $C_0$ coupled to the output port N1 of the switch 204_1 is selected as one selected column for data comparison.

As shown in FIG. 2, the control unit 206_2 is the second control unit. Hence, the input bit received by the switch controller 214_2 is the switch control signal SW[0] generated from the preceding control unit (i.e., the control unit 206_1). As the compare result "0" of the compare unit 212_2 is identical to the switch control signal SW[0]="0", an output of the switch controller 214_2 is set by the first logic value "0" due to the XOR operation. Therefore, the switch control signal SW[1] is set by "0", and the main column $C_1$ coupled to the output port N1 of the switch 204_2 is selected as one selected column for data comparison.

As shown in FIG. 2, the control unit 206_3 is the third control unit. Hence, the input bit received by the switch controller 214_3 is the switch control signal SW[1] generated from the preceding control unit (i.e., the control unit 206_2). As the compare result "1" of the compare unit 212_3 is different from the switch control signal SW[1]="0", an output of the switch controller 214_3 is set by the second logic value "1" due to the XOR operation. As the switch control signal SW[2] is set by "1", the main column $C_2$ coupled to the output port N1 of the switch 204_3 is skipped and the next main column $C_3$ coupled to the other output port N2 of the switch 204_3 is selected as one selected column for data comparison. Specifically, the bit of the input search data at the data line DL[2] is transmitted to each CAM cell located at the main column $C_3$ for data comparison.

As shown in FIG. 2, the control unit 206_4 is the fourth control unit. Hence, the input bit received by the switch controller 214_4 is the switch control signal SW[2] generated from the preceding control unit (i.e., the control unit 206_3). As the compare result "0" of the compare unit 212_2 is different from the switch control signal SW[2]="1", an output of the switch controller 214_4 is set by the second logic value "1" due to the XOR operation. Therefore, the switch control signal SW[3] is set by "1", and the main column $C_4$ coupled to the output port N2 of the switch 204_4 is selected as one selected column for data comparison. With regard to each of the switches (not shown) following the switch 204_4, the internal interconnection of the switch is identical to that of the switch 204_4 due to the fact that the compare unit would produce the first logic value (e.g., "0"), and the switch control signal generated from the preceding control unit would have the second logic value (e.g., "1").

As the redundant column $C_R$ acts as replacement of one main column when the main column $C_2$ is identified as a faulty column, the look-up table data are stored into main columns $C_0$-$C_1$, $C_3$-$C_7$ and redundant column $C_R$, rather than main columns $C_0$-$C_7$. Based on the control of the control circuit 106, data lines DL[0]-DL[7] are coupled to bit lines BL[0], BL[1], BL[3]-BL[8], respectively. Thus, when the input search data D_IN is received via the data lines DL[0]-DL[7], the look-up table data stored in main columns $C_0$-$C_1$, $C_3$-$C_7$ and redundant column $C_R$ are compared with the input search data D_IN under the condition that each CAM cell in the faulty column $C_2$ is set at a match state. In this way, correct data comparison outputs of the rows in the CAM array 102 are generated.

In the embodiment shown in FIG. 1, the column repair mechanism is implemented in the CAM 100 with the CAM array 102 having a single redundant column $C_R$ such that the redundant column $C_R$ can act as replacement of one main column when one of main columns of the CAM array 102 is a faulty column. However, the same column repair concept can be applied to a CAM with a CAM array having more than one redundant column.

Figure 3:
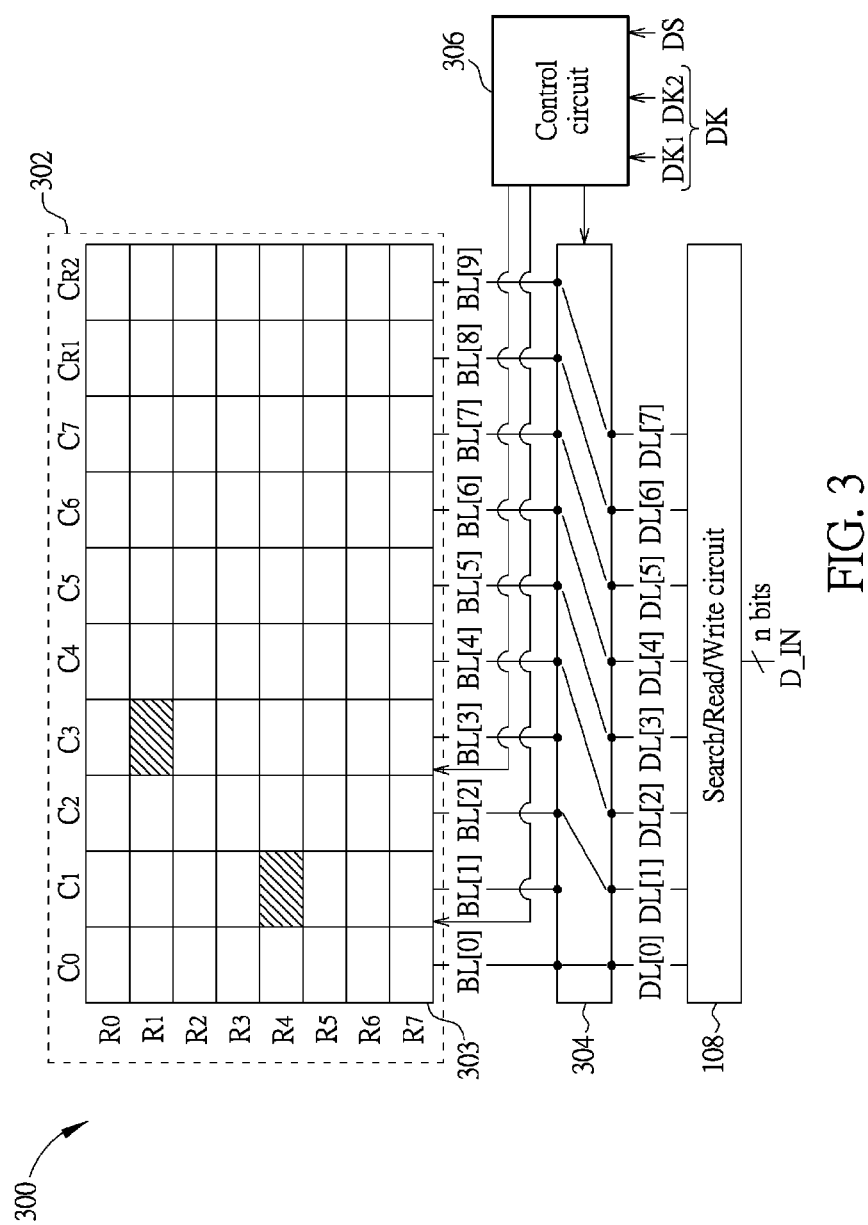
FIG. 3 is a diagram illustrating a CAM according to a second embodiment of the present invention.

Please refer to FIG. 3, which is a diagram illustrating a CAM according to a second embodiment of the present invention. The CAM 300 includes a CAM array 302, a path selection circuit 304, a control circuit 306, and the aforementioned search/read/write circuit 108. The CAM array 302 includes a plurality of CAM cells 303 arranged in an array composed of a plurality of rows $R_0$-$R_7$ and a plurality of columns $C_0$-$C_7$, $C_{R1}$-$C_{R2}$, wherein each CAM cell 303 may include an SRAM cell and a compare circuit. In this embodiment, the CAM array 302 includes main columns $C_0$-$C_7$ of CAM cells 103 and multiple redundant columns $C_{R1}$, $C_{R2}$ of CAM cells 103. It should be noted that the number of multiple redundant columns shown in FIG. 3 is for illustrative purposes only. In an alternative design, the CAM array 302 may have more than two redundant columns.

For example, during a search operation, the search/read/write circuit 108 is arranged to latch the N-bit input search data DIN, wherein the bit length of the input search data D_IN is equal to the number of main columns in the CAM array 302. In this example, N=8. Similarly, the path selection circuit 304 is coupled between the CAM array 302 and the search/read/write circuit 108, and arranged for receiving bits of the input search data D_IN from the search/read/write circuit 108 via data lines DL[0]-DL[7], respectively, and outputting bits of the input search data D_IN to a plurality of selected columns in the CAM array 302 via corresponding bit lines, respectively. In this example, after the CAM array 302 is manufactured, one CAM cell located at row $R_4$ and column $C_1$ is identified as a faulty CAM cell, and another CAM cell located at row $R_1$ and column $C_3$ is also identified as a faulty CAM cell. Hence, before the CAM 300 is actually used for data comparison, the proposed column repair mechanism is activated to use the redundant columns $C_{R1}$, $C_{R2}$ as replacement of two main columns, thus preventing the faulty CAM columns $C_1$, $C_3$ from having impact on the comparison result of each row. Hence, the control circuit 306 is responsible for controlling the path selection circuit 304 to couple to the selected columns, and setting each CAM cell 303 of the faulty columns $C_1$, $C_3$ found in the main columns $C_0$-$C_7$ at a match state, wherein the faulty columns $C_1$, $C_3$ are not included in the selected columns, and the redundant columns $C_{R1}$, $C_{R2}$ are included in the selected columns.

As the match/mismatch condition of each row (i.e., the compare result of each row) is determined by all CAM cells located at the same row, each CAM cell of the faulty columns $C_1$, $C_3$ is set to the match state such that the CAM cells of the faulty columns $C_1$, $C_3$ do not affect the data comparison outputs of the rows. In this embodiment, the control circuit 306 may generate mask signals to each CAM cell of the faulty columns $C_1$, $C_3$ to set the CAM cell at a "don't care" state. In this way, CAM cells of the faulty columns $C_1$, $C_3$ may be regarded as bypassed since there is no mismatch path existing in each CAM cell of the faulty columns $C_1$, $C_3$.

Figure 4:
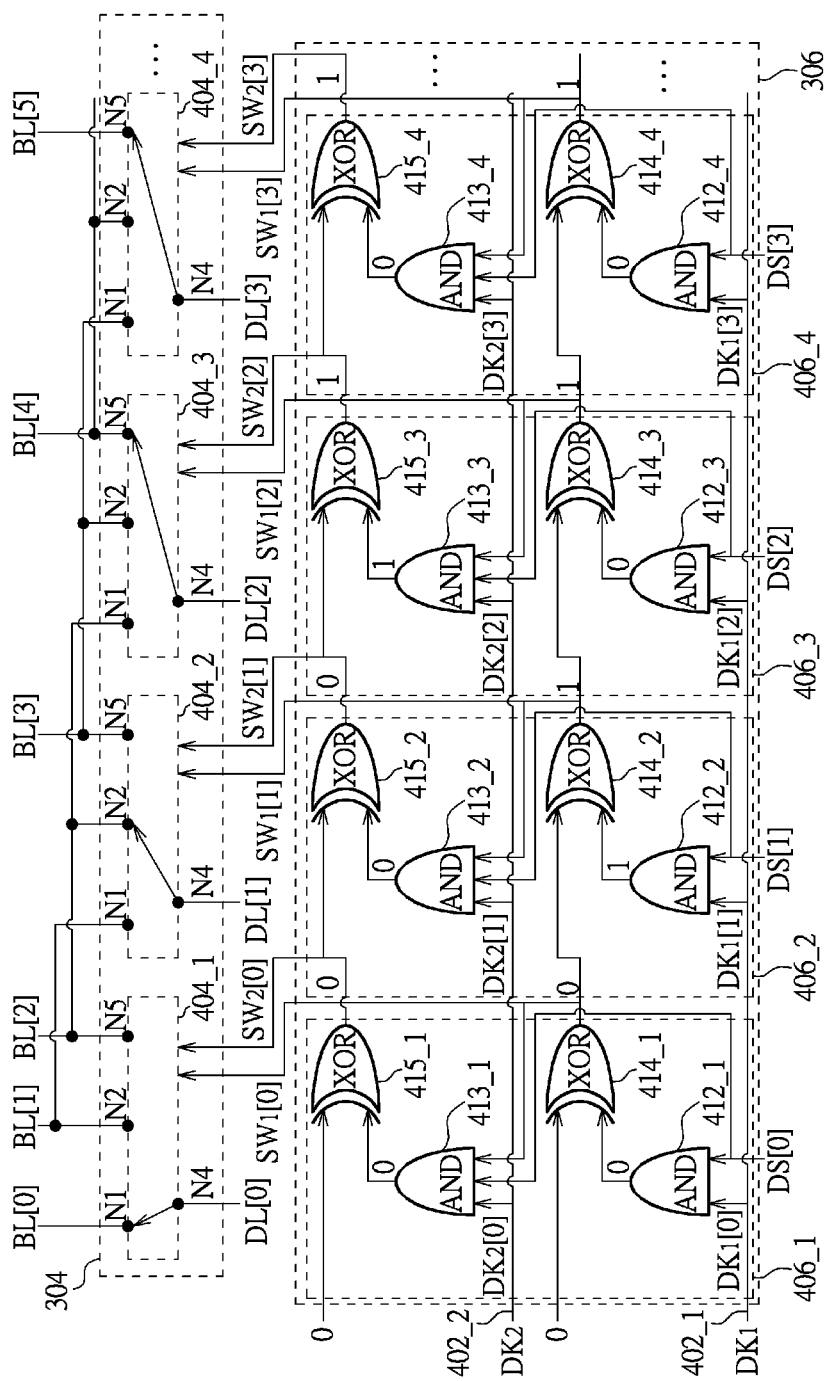
FIG. 4 is a circuit diagram of the control circuit and the path selection circuit shown in FIG. 3 according to an embodiment of the present invention.

With regard to the path selection circuit 304 which skips the faulty columns $C_1$, $C_3$ and guides bits of the input search data (e.g., a search word) to the selected columns in the CAM array 302. Please refer to FIG. 4. FIG. 4 is a circuit diagram of the control circuit 306 and the path selection circuit 304 shown in FIG. 3 according to an embodiment of the present invention. For simplicity and clarity, only part of the circuit architecture of the control circuit 306 and only part of the circuit architecture of the path selection circuit 304 are illustrated in FIG. 4. The path selection circuit 304 includes a plurality of switches (e.g., 404_1, 404_2, 404_3, and 404_4 shown in FIG. 4), and the control circuit 306 includes a plurality of control units (e.g., 406_1, 406_2, 406_3, and 406_4 shown in FIG. 4). Each of the switches 404_1-404_4 has an input port N4 and a plurality of output ports N1, N2 and N5, and is controlled by the control circuit 306 to couple the input port N4 to one of the output ports N1, N2 and N5. The input ports N4 of the switches 404_1-404_4 are arranged for receiving the bits of the input search data D_IN, respectively.

In this embodiment, each of the switches 404_1~404_4 is responsive to a plurality of switch control signals. As shown in FIG. 4, each of the switches 404_1-404_4 is controlled by a first switch control signal $SW_1[0]/SW_1[1]/SW_1[2]/SW_1[3]$ and a second switch control signal $SW_2[0]/SW_2[1]/SW_2[2]/SW_2[3]$ generated from the control circuit 306. When a first switch control signal and a second switch control signal are both set by a first logic value (e.g., 0), a corresponding switch couples the input port N4 to the output port N1; when the first switch control signal is set by the first logic value (e.g., 0) and the second switch control signal is set by a second logic value (e.g., 1), the corresponding switch couples the input port N4 to the output port N2; and when the first switch control signal and the second switch control signal are both set by the second logic value (e.g., 1), the corresponding switch couples the input port N4 to the output port N5. The output port N1 of the switch is coupled to the bit line BL[n] when the corresponding control unit (which generates the first switch control signal and the second switch control signal to the switch) receives the bit DS[n] of the input search data D_IN. Hence, when output ports N1, N2, N5 of the current switch are coupled to bit lines BL[n], BL[n+1] and BL[n+2], output ports N1, N2, N5 of the next switch are coupled to bit lines BL[n+1], BL[n+2] and BL[n+3].

In this embodiment, the control circuit 306 controls the path selection circuit 304 according to a predetermined syndrome pattern DS and a control key DK, where the control key DK is composed of a first control key $DK_1$ and a second control key $DK_2$. The bit length of the predetermined syndrome pattern DS is equal to the number of main columns of the CAM array 302, the bit length of the first control key $DK_1$ is equal to the number of main columns of the CAM array 302, and the bit length of the second control key $DK_2$ is equal to the number of main columns of the CAM array 302. The predetermined syndrome pattern DS is a fixed bit sequence which is set beforehand. When the faulty columns $C_1$, $C_3$ are found by testing the CAM array 302, the first control key $DK_1$ and the second control key $DK_2$ may be programmed using an e-fuse device, where bits of the first control key $DK_1$ and the second control key $DK_2$ are set based on bits of the predetermined syndrome pattern DS and the identified faulty columns $C_1$, $C_3$. Hence, by comparing bits of the first control key $DK_1$ and the second control key $DK_2$ with bits of the predetermined syndrome pattern DS, the control circuit 306 knows which main columns in the CAM array 302 are faulty columns. In this embodiment, a two-level comparison is employed for controlling each switch of the path selection circuit 304, where a first-level comparison decides the first faulty column, and a second-level comparison decides the second faulty column. Further details are described as below.

As shown in FIG. 4, the first control key $DK_1$ stored in the e-fuse device may be transmitted to the control units 406_1-406_4 via a first bus 402_1, and the second control key $DK_2$ stored in the e-fuse device may be transmitted to the control units 406_1-406_4 via a second bus 402_2. Each of the control units 406_1-406_4 includes a first compare unit 412_1/412_2/412_3/412_4, a first switch controller 414_1/414_2/414_3/414_4, a second compare unit 413_1/413_2/413_3/413_4, and a second switch controller 415_1/415_2/415_3/415_4. By way of example, but not limitation, each of the first compare units 412_1-412_4 is implemented using an AND gate configured to perform an AND operation upon one bit $DK_1[0]/DK_1[1]/DK_1[2]/DK_1[3]$ of the first control key $DK_1$ and one bit DS[0]/DS[1]/DS[2]/DS[3] of the predetermined syndrome pattern DS; each of the second compare units 413_1-413_4 is implemented using an AND gate configured to perform an AND operation upon one bit $DK_2[0]/DK_2[1]/DK_2[2]/DK_2[3]$ of the second control key DK2, one bit DS[0]/DS[1]/DS[2]/DS[3] of the predetermined syndrome pattern DS, and a first comparison result generated from a first compare unit in the same control unit.

In addition, each of the first switch controllers 414_1-414_4 is implemented using an XOR gate configured to perform an XOR operation upon the first compare result (which is generated from a first compare unit in the same control unit) and an input bit (which has a predetermined logic value (e.g., 0) or is a first switch control signal generated from another control unit) to generate a first switch control signal; and each of the second switch controllers 415_1-415_4 is implemented using an XOR gate configured to perform an XOR operation upon the second compare result (which is generated from a second compare unit in the same control unit) and an input bit (which has a predetermined logic value (e.g., 0) or is a second switch control signal generated from another control unit) to generate a second switch control signal.

One of the faulty columns (e.g., faulty column $C_1$) is skipped due to the first-level comparison, and the other of the faulty columns (e.g., faulty column $C_3$) is skipped due to the second-level comparison. More specifically, as the main column $C_1$ is a faulty column, the first control key $DK_1$ is properly set such that first compare results of first compare unit 412_1 preceding the first compare unit 412_2 and first compare units 412_3, 412_4 following the first compare unit 412_2 all have a first logic value (e.g., 0), and only the first compare result of the first compare unit 412_2 has a second logic value (e.g., 1). In this way, the control circuit 306 refers to the first-level comparison to know that the main column $C_1$ is a faulty column and should be skipped.

Similarly, as the main column $C_3$ is a faulty column, the second control key $DK_2$ is properly set such that second compare results of second compare units 413_1, 413_2 preceding the second compare unit 413_3 and second compare unit 413_4 following the second compare unit 413_3 all have the first logic value (e.g., 0), and only the second compare result of the second compare unit 413_3 has the second logic value (e.g., 1). In this way, after the faulty column $C_1$ is known by the control circuit 106 based on the first-level comparison which indicates that the first compare unit 412_2 has a logic high output, the faulty column $C_1$ is skipped in the column selection at the path selection circuit 304, and the control circuit 306 refers to the second-level comparison which indicates the second compare unit 413_3 has a logic high output to thereby know that the main column $C_3$ is a faulty column and should be skipped.

As shown in FIG. 4, the control unit 406_1 is the first control unit. Hence, an input bit with the predetermined logic value (e.g., 0) is fed into the first switch controller 414_1, and another input bit with the predetermined logic value (e.g., 0) is fed into the second switch controller 415_1. As the first compare result "0" of the first compare unit 412_1 is identical to the input bit with the predetermined logic value "0", an output of the first switch controller 414_1 is set by the first logic value "0" due to the XOR operation. In addition, as the second compare result "0" of the second compare unit 413_1 is identical to the input bit with the predetermined logic value "0", an output of the second switch controller 415_1 is set by the first logic value "0" due to the XOR operation. Therefore, the first switch control signal $SW_1[0]$ is set by "0", the second switch control signal $SW_2[0]$ is set by "0", and the main column $C_0$ coupled to the output port N1 of the switch 404_1 is selected as one selected column for data comparison.

As shown in FIG. 4, the control unit 406_2 is the second control unit. Hence, the input bit received by the first switch controller 414_2 is the first switch control signal $SW_1[0]$ generated from the preceding control unit (i.e., the control unit 406_1), and the input bit received by the second switch controller 415_2 is the second switch control signal $SW_2[0]$ generated from the preceding control unit (i.e., the control unit 406_1). As the first compare result "1" of the first compare unit 412_2 is different from the first switch control signal $SW_1[0]$="0", an output of the first switch controller 414_2 is set by the second logic value "1" due to the XOR operation. As the second compare result "0" of the second compare unit 413_2 is identical to the second switch control signal $SW_2[0]$="0", an output of the second switch controller 415_2 is set by the first logic value "0" due to the XOR operation. Therefore, the first switch control signal $SW_1[1]$ is set by "1", the second switch control signal $SW_2[1]$ is set by "0", the faulty column $C_1$ coupled to the output port N1 of the switch 404_2 is skipped, and the main column $C_2$ coupled to the output port N2 of the switch 404_2 is selected as one selected column for data comparison. Specifically, the bit of the input search data at the data line DL[1] is transmitted to each CAM cell located at the main column $C_2$ for data comparison.

As shown in FIG. 4, the control unit 406_3 is the third control unit. Hence, the input bit received by the first switch controller 414_3 is the first switch control signal $SW_1[1]$ generated from the preceding control unit (i.e., the control unit 406_2), and the input bit received by the second switch controller 415_3 is the second switch control signal $SW_2[1]$ generated from the preceding control unit (i.e., the control unit 406_2). As the compare result "0" of the compare unit 412_3 is different from the first switch control signal $SW_1[1]$="1", an output of the first switch controller 414_3 is set by the second logic value "1" due to the XOR operation. As the compare result "1" of the compare unit 413_3 is different from the second switch control signal $SW_2[1]$="0", an output of the second switch controller 415_3 is set by the second logic value "1" due to the XOR operation. Therefore, the first switch control signal $SW_1[1]$ is set by "1", the second switch control signal $SW_2[1]$ is set by "1", the faulty column $C_3$ coupled to the output port N2 of the switch 404_3 is skipped, and the main column $C_4$ coupled to the output port N5 of the switch 404_3 is selected as one selected column for data comparison. Specifically, the bit of the input search data at the data line DL[2] is transmitted to each CAM cell located at the main column $C_4$ for data comparison.

As shown in FIG. 4, the control unit 406_4 is the fourth control unit. Hence, the input bit received by the first switch controller 414_4 is the switch control signal $SW_1[2]$ generated from the preceding control unit (i.e., the control unit 406_3), and the input bit received by the second switch controller 415_4 is the switch control signal $SW_2[2]$ generated from the preceding control unit (i.e., the control unit 406_3).

As the compare result "0" of the first compare unit 412_4 is different from the first switch control signal $SW_1[2]$="1", an output of the first switch controller 414_4 is set by the second logic value "1" due to the XOR operation. As the compare result "0" of the second compare unit 413_4 is different from the second switch control signal $SW_2[2]$="1", an output of the second switch controller 415_4 is set by the second logic value "1" due to the XOR operation. Therefore, the first switch control signal $SW_1[3]$ is set by "1", the second switch control signal $SW_2[3]$ is set by "1", and the main column $C_5$ coupled to the output port N5 of the switch 404_4 is selected as one selected column for data comparison.

Specifically, the bit of the input search data at the data line DL[3] is transmitted to each CAM cell located at the main column $C_5$ for data comparison. With regard to each of the switches (not shown) following the switch 404_4, the interconnection of the switch is identical to that of the switch 404_4 due to the fact that the compare unit would produce the first logic value (e.g., "0"), and the switch control signal generated from the preceding control unit would have the second logic value (e.g., "1").

As the redundant column $C_{R1}$, $C_{R2}$ act as replacement of two main columns when the main columns $C_1$, $C_3$ are identified as faulty columns, the look-up table data are stored into main columns $C_0$, $C_2$, $C_4$-$C_7$ and redundant columns $C_{R1}$, $C_{R2}$, rather than main columns $C_0$-$C_7$. Based on the control of the control circuit 406, data lines DL[0]-DL[7] are coupled to bit lines BL[0], BL[2], BL[4]-BL[9], respectively. Thus, when the input search data D_IN is received via the data lines DL[0]-DL[7], the look-up table data stored in main columns $C_0$, $C_2$, $C_4$-$C_7$ and redundant columns $C_{R1}$, $C_{R2}$ are compared with the input search data D_IN under the condition that each CAM cell in the faulty columns $C_1$, $C_3$ is set at a match state. In this way, correct data comparison outputs of the rows in the CAM array 302 are generated.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A content addressable memory (CAM), comprising:
   a CAM array, comprising a plurality of main columns of CAM cells and at least one redundant column of CAM cells;
   a path selection circuit, arranged for receiving an input search data, and outputting a plurality of bits of the input search data to a plurality of selected columns in the CAM array, respectively; and
   a control circuit, arranged for controlling the path selection circuit to couple to the selected columns, and setting each CAM cell of at least one faulty column found in the main columns at a match state, wherein the at least one faulty column is not included in the selected columns, and the at least one redundant column is included in the selected columns;
   wherein the path selection circuit comprises:
      a plurality of switches, each having an input port and a plurality of output ports, wherein each switch is controlled by the control circuit to couple the input port to one of the output ports, and input ports of the switches are arranged for receiving the bits of the input search data, respectively;
   the control circuit controls the path selection circuit according to a predetermined syndrome pattern and a control key; and the control circuit comprises:

a plurality of control units, arranged for controlling the switches, respectively, wherein each of the control units comprises:
   a first compare unit, arranged for comparing a bit of the predetermined syndrome pattern and a first bit of the control key, and accordingly generating a first compare result; and
   a first switch controller, arranged for generating a first switch control signal according to at least the compare result, where a corresponding switch is responsive to at least the first switch control signal.

2. The CAM of claim 1, wherein the first compare unit is an AND gate.

3. The CAM of claim 1, wherein the first switch controller is further arranged for receiving an input bit that has a predetermined logic value or is a first switch control signal generated from another control unit; and the first switch control signal is generated based on the input bit and the first compare result.

4. The CAM of claim 3, wherein the first switch controller is an XOR gate.

5. The CAM of claim 3, wherein each of the control units further comprises:
   a second compare unit, arranged for comparing the bit of the predetermined syndrome pattern, a second bit of the control key, and the first compare result, and accordingly generating a second compare result; and
   a second switch controller, arranged for generating a second switch control signal according to at least the second compare result, wherein the corresponding switch is responsive to at least the first switch control signal and the second switch control signal.

6. The CAM of claim 5, wherein each of the first compare unit and the second compare unit is an AND gate.

7. The CAM of claim 5, wherein the first switch controller is further arranged for receiving a first input bit that has a predetermined logic value or is a first switch control signal generated from another control unit; the second switch controller is further arranged for receiving a second input bit that has a predetermined logic value or is a second switch control signal generated from the another control unit; the first switch control signal is generated based on the first input bit and the first compare result; and the second switch control signal is generated based on the second input bit and the second compare result.

8. The CAM of claim 7, wherein each of the first switch controller and the second switch controller is an XOR gate.

9. A column repair method of a content addressable memory (CAM), comprising:
   setting each CAM cell of at least one faulty column found in a plurality of main columns of CAM cells at a match state, wherein the CAM has a CAM array comprising the main columns of CAM cells and at least one redundant column of CAM cells; and
   receiving an input search data and outputting a plurality of bits of the input search data to a plurality of selected columns in the CAM array, respectively;
   wherein the at least one faulty column is not included in the selected columns, and the at least one redundant column is included in the selected columns;
   the step of receiving the input search data and outputting the bits of the input search data to the selected columns comprises:
      utilizing input ports of a plurality of switches for receiving the bits of the input search data, respectively, wherein each switch has an input port and a plurality of output ports; and
      regarding each switch, controlling the switch to couple the input port to one of the output ports;
   the switches are controlled according to a predetermined syndrome pattern and a control key; and the step of controlling the switch to couple the input port to one of the output ports comprises:
      comparing a bit of the predetermined syndrome pattern and a first bit of the control key, and accordingly generating a first compare result; and
      generating a first switch control signal according to at least the compare result, where a corresponding switch is responsive to at least the first switch control signal.

10. The column repair method of claim 9, wherein the first compare result is generated from performing an AND operation upon the bit of the predetermined syndrome pattern and the first bit of the control key.

11. The column repair method of claim 9, wherein the first switch control signal is generated based on an input bit and the first compare result; and the input bit has a predetermined logic value or is a first switch control signal generated for another switch.

12. The column repair method of claim 11, wherein the first switch control signal is generated from performing an XOR operation upon the input bit and the first compare result.

13. The column repair method of claim 11, wherein the step of controlling the switch to couple the input port to one of the output ports further comprises:
   comparing the bit of the predetermined syndrome pattern, a second bit of the control key, and the first compare result, and accordingly generating a second compare result; and
   generating a second switch control signal according to at least the second compare result, where the corresponding switch is responsive to at least the first switch control signal and the second switch control signal.

14. The column repair method of claim 13, wherein the first compare result is generated from performing an AND operation upon the bit of the predetermined syndrome pattern and the first bit of the control key; and the second compare result is generated from performing an AND operation upon the bit of the predetermined syndrome pattern, the second bit of the control key, and the first compare result.

15. The column repair method of claim 13, wherein the first switch control signal is generated based on a first input bit and the first compare result; the second switch control signal is generated based on a second input bit and the second compare result; the first input bit has a predetermined logic value or is a first switch control signal generated for another switch; and the second input bit has a predetermined logic value or is a second switch control signal generated for the another switch.

16. The column repair method of claim 15, wherein the first switch control signal is generated from performing an XOR operation upon the first input bit and the first compare result; and the second switch control signal is generated from performing an XOR operation upon the second input bit and the second compare result.

* * * * *